(12) United States Patent
Huang

(10) Patent No.: US 7,610,948 B2
(45) Date of Patent: Nov. 3, 2009

(54) COOLER MODULE

(76) Inventor: Tsung-Hsien Huang, No 18-28, Ta Hu Rd., Hu Pei Village, Yuan Shan Hsiang, I-Lan Hsien (TW)

( * ) Notice: Subject to any disclaimer, the term of this patent is extended or adjusted under 35 U.S.C. 154(b) by 273 days.

(21) Appl. No.: 11/828,294

(22) Filed: Jul. 25, 2007

(65) Prior Publication Data
US 2009/0025909 A1 Jan. 29, 2009

(51) Int. Cl.
*H05K 7/20* (2006.01)
(52) U.S. Cl. .................. 165/80.3; 165/104.33; 361/700
(58) Field of Classification Search ................ 165/80.3, 165/104.33; 361/700
See application file for complete search history.

(56) References Cited

U.S. PATENT DOCUMENTS

| 6,978,829 | B1 * | 12/2005 | Lin ........................ 165/104.33 |
| 7,000,687 | B2 * | 2/2006 | Ying et al. ............. 165/104.33 |
| 7,036,566 | B1 | 5/2006 | Huang |
| 7,275,587 | B2 | 10/2007 | Kuo |
| 7,443,676 | B1 * | 10/2008 | Li .............................. 361/700 |
| 2004/0194310 | A1 * | 10/2004 | Lin et al. .................. 29/890.03 |
| 2006/0011329 | A1 * | 1/2006 | Wang et al. ............ 165/104.33 |
| 2006/0032616 | A1 * | 2/2006 | Yang ...................... 165/104.33 |
| 2006/0104032 | A1 * | 5/2006 | Lee et al. ..................... 361/700 |
| 2006/0255453 | A1 * | 11/2006 | Wu ............................. 257/720 |
| 2006/0266500 | A1 * | 11/2006 | Lin et al. ................ 165/104.33 |
| 2006/0278374 | A1 * | 12/2006 | Hao et al. .............. 165/104.33 |
| 2007/0144710 | A1 * | 6/2007 | Cheng ................... 165/104.33 |
| 2007/0217153 | A1 * | 9/2007 | Lai et al. ..................... 361/700 |

FOREIGN PATENT DOCUMENTS

JP 11351769 A * 12/1999

* cited by examiner

*Primary Examiner*—Allen J Flanigan
(74) *Attorney, Agent, or Firm*—Pai Patent & Trademark Law Firm; Chao-Chang David Pai

(57) ABSTRACT

A non-welding cooler module includes a heat sink formed of a stack of radiation fins, a base block tightly fitted into the bottom side of the heat sink, heat pipes tightly inserted through the radiation fins and partially fitted into respective bottom open grooves of the base block with a respective flat wall portion thereof kept in flush with the bottom wall of the base block, and a thermal pad affixed to the bottom wall of the base block to hold down the heat pipes in the bottom open grooves of the base block for transferring heat energy from an external electronic chip to the heat pipes and the heat sink for quick dissipation.

13 Claims, 7 Drawing Sheets

COOLER MODULE

BACKGROUND OF THE INVENTION (a) Field of the Invention

The present invention relates to a cooler module for cooling an electronic chip and more particularly to such a cooler module, which has its parts tightly fitted together with a thermal pad at the bottom side of the base block thereof kept in close contact with the hot part of an electronic chip for dissipation of heat energy from the electronic chip rapidly.

(b) Description of the Prior Art

Heat pipes are intensively used in cooler modules for cooling semiconductor chips or the like. In addition to heat tubes, a cooler module further comprises a heat sink formed of a stack of radiation fins, and a base block. The radiation fins are extruded from aluminum or copper. The heat tubes are enclosed metal tubes filled with a working fluid. The base block is an aluminum or copper block. Because the heat tubes and base block of this design of cooler module are made of different materials, a nickel plating technique is necessary so that the heat pipes and the base block can be bonded together by applying a tin solder or thermal glue. The fabrication and assembly of this cooler module is complicated, resulting in low yield rate and high manufacturing cost. Soldering between the base block and the heat tubes relatively lowers the heat transfer efficiency of the cooler module. Further, soldering the heat tubes to the base block may cause environmental pollution, not in conformity with environmental regulations. Although a copper base block has a thermal conductivity better than an aluminum base block, use of expensive copper material relatively increases the cost of the cooler module. Therefore, aluminum is commonly used for making base blocks for cooler modules. However, an aluminum base block has a relatively lower thermal conductivity relative to a copper base block. It is difficult to cut the cost while maintaining a high thermal conductivity.

SUMMARY OF THE INVENTION

The present invention has been accomplished under the circumstances in view. According to one aspect of the present invention, the cooler module comprises a plurality of radiation fins, a plurality of heat tubes, a base block, and a thermal pad. The component parts of the cooler module are tightly fitted together. The heat tubes each have a flat wall portion exposed out of the base block and kept in flush with the bottom wall of the base block. The thermal pad is a thin sheet of metal (such as copper), and affixed to the bottom wall of the base block to cover the heat tubes partially, holding down the heat tubes on the base block for quick dissipation of heat energy from the hot part of the electronic chip to which the thermal pad is attached.

According to another aspect of the present invention, the component parts of the cooler module are tightly fitted together. Upon thermal expansion, the connection of the component parts of the cooler module is enhanced, thus providing excellent heat conduction and heat dissipation performance. Because the cooler module eliminates tin soldering or nickel plating, the fabrication of the present invention does not cause environmental pollution. Therefore, the fabrication of the present invention is in conformity with environmental regulations.

According to another aspect of the present invention, the base block is extruded from aluminum, and the thermal pad is extruded from copper and fixedly fastened to the bottom wall of the base block to hold down the heat pipes for quick dissipation of heat from the electronic chip to which the thermal pad is attached. Therefore, the invention effectively reduces the manufacturing cost while maintaining excellent thermal conduction.

According to still another aspect of the present invention, the thermal pad can be riveted, fitted, or compression-bonded to the bottom wall of the base block to hold down the heat pipes, keeping the heat pipes, the heat sink and the base block tightly together. This assembly process is simple and inexpensive, and can hold the parts firmly together against vibration during transportation. The parts will not fall from one another upon a drastic temperature change.

According to still another aspect of the present invention, the base block has a plurality of bottom open grooves, which receive the heat pipes respectively, and a plurality of clamping ribs protruded from the bottom wall and extending along two opposite sides of each of the bottom open grooves. After insertion of the heat pipes into the bottom open grooves of the base block, the clamping ribs clamp the heat pipes, holding the heat pipes firmly in the associated bottom open grooves.

According to still another aspect of the present invention, the heat pipes are configured to fit the configuration of the base block, keeping the respective flat wall portion exposed to the outside of the base block for close contact with the thermal pad.

DETAILED DESCRIPTION OF THE PREFERRED EMBODIMENTS

Figure 1:
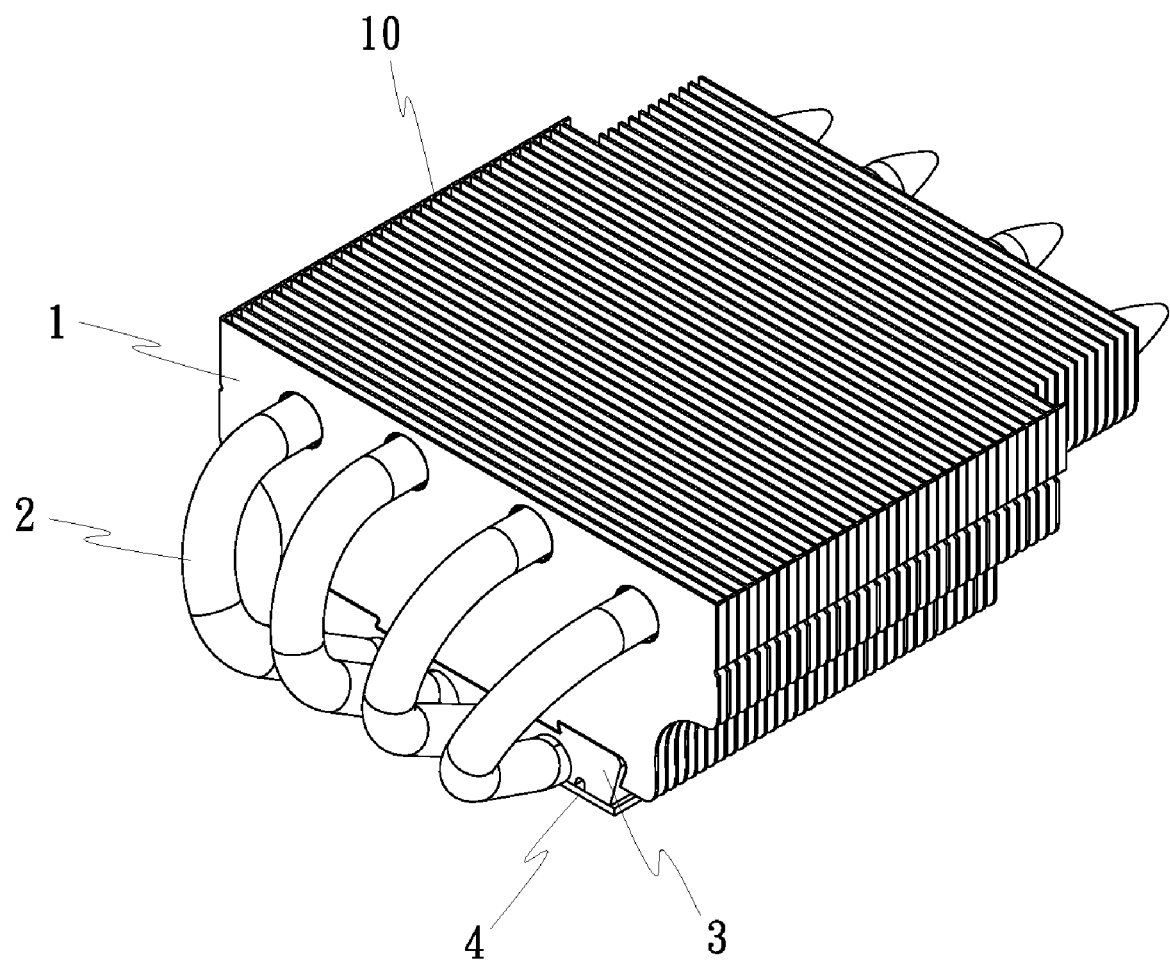
FIG. 1 is a top perspective view of a cooler module in accordance with a first embodiment of the present invention.
Figure 2:
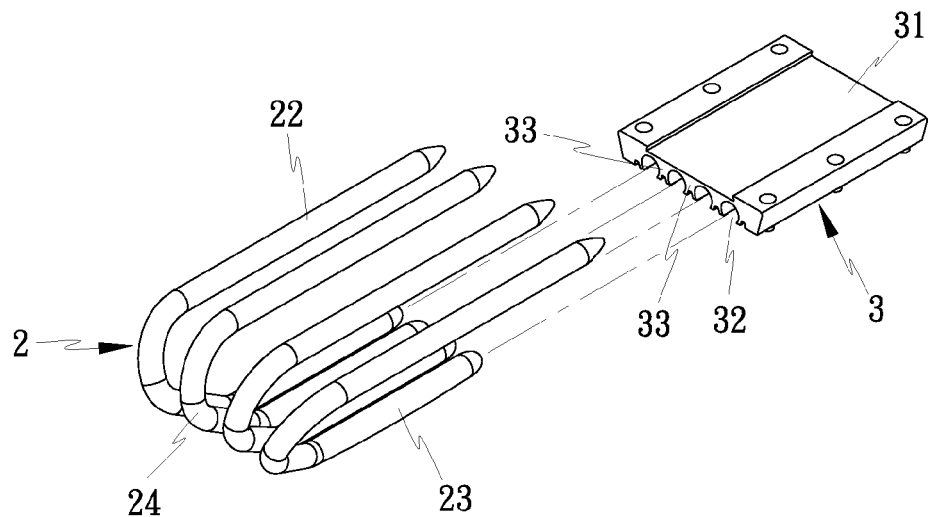
FIG. 2 is an exploded view of the heat pipes and the base block for the cooler module in accordance with the first embodiment of the present invention.
Figure 3:
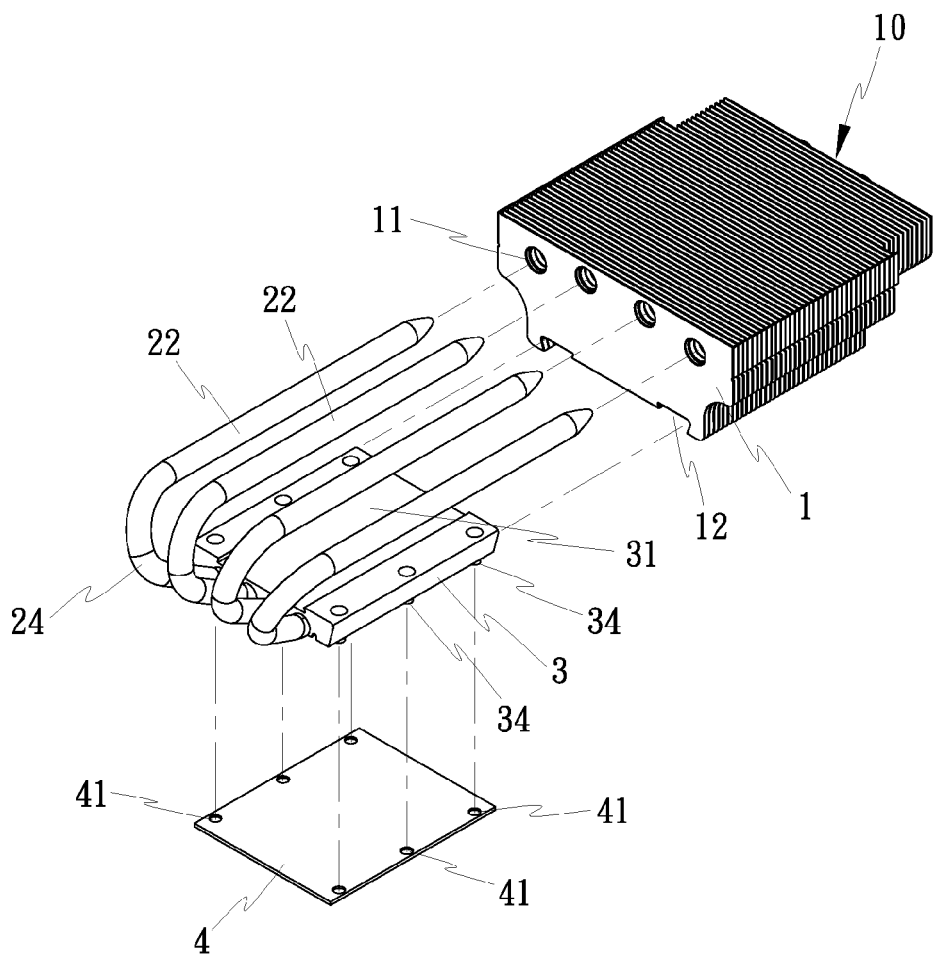
FIG. 3 is an exploded view of the cooler module in accordance with the first embodiment of the present invention.
Figure 4:
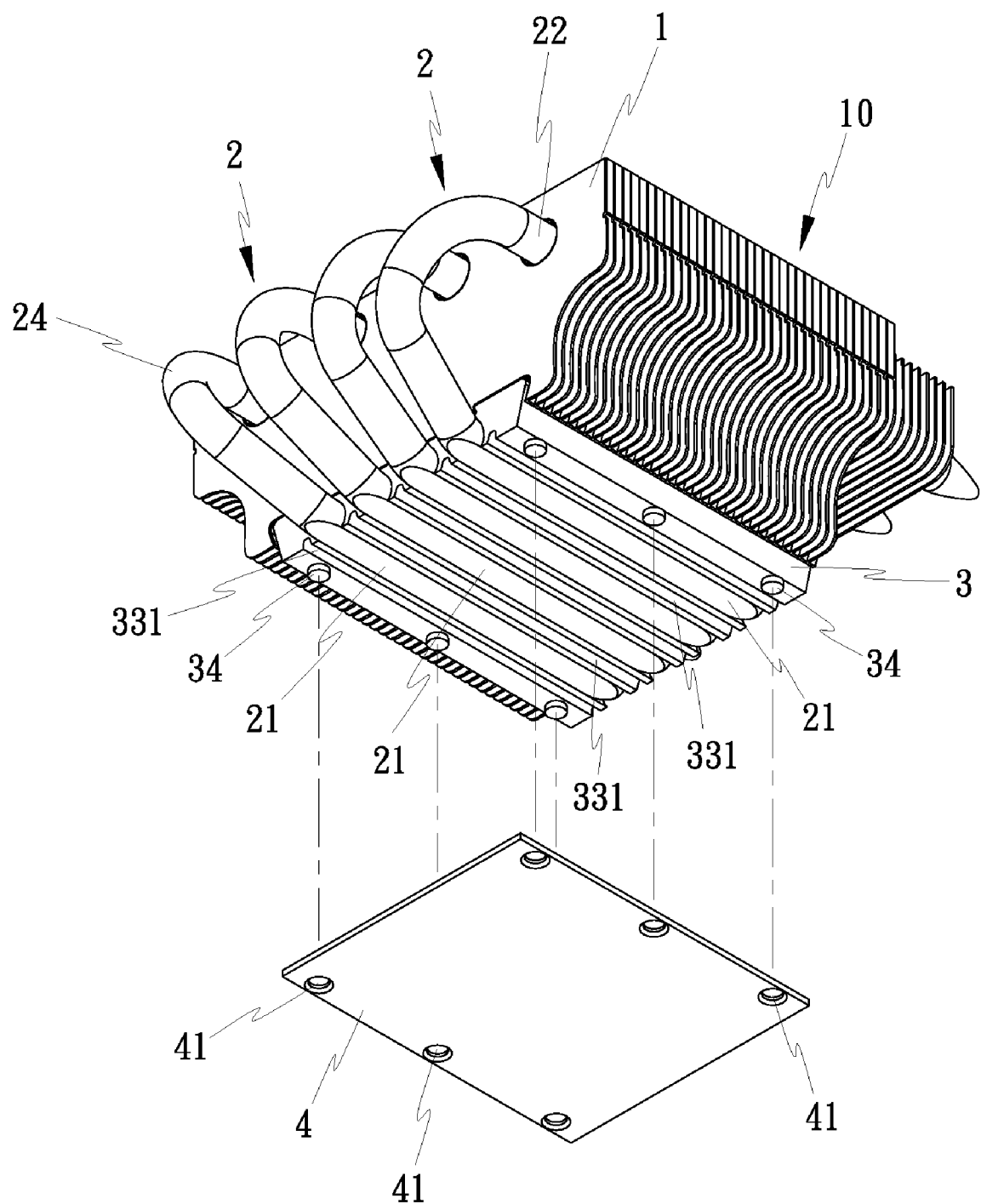
FIG. 4 is another exploded view of the heat pipes and the base block for the cooler module in accordance with the first embodiment of the present invention.

Referring to FIG. 1, a cooler module in accordance with a first embodiment of the present invention is shown comprised of a plurality of radiation fins 1, a plurality of heat pipes 2, a base block 3, and a thermal pad 4.

The radiation fins 1 are stacked together, forming a heat sink 10. Each radiation fin 1 has a plurality of through holes 11 for receiving the heat pipes 2 in a tight manner, and a bottom notch 12 of a predetermined profile for matching the upper part of the base block 3.

The heat pipes 2 are enclosed pipes filled with a working fluid, each having a flat wall portion 21 and fastened to the bottom side of the base block 3 and kept in flush with the bottom surface of the base block 3.

The base block 3 is a solid metal (copper or aluminum) block, having a top wall 31 that fits the bottom wall of the heat sink 10, a plurality of bottom open grooves 32, which receive the heat pipes 2 respectively, a plurality of clamping ribs 33 respectively longitudinally extending along two opposite sides of each of the bottom open grooves 32 for securing the heat pipes 2 to the bottom open grooves 32.

The thermal pad 4 is a thin metal (copper) sheet of good thermal conductivity fitting the bottom wall of the bottom block 3 in size and closely bonded to the bottom wall of the bottom block 3 to shield the heat pipes 2. After installation, the two opposite sides of the thermal pad 4 are kept in close contact with the flat wall portions 21 of the heat pipes 2 and the hot part of an electronic chip (CPU or GPU; not shown). The thermal pad 4 may be bonded to the bottom wall of the bottom block 3 by means of a joint, compression bonding, or any of a variety of other conventional techniques. According to this embodiment, the thermal pad 4 has a plurality of rivet holes 41 fastened to respective rivets 34 at the bottom wall of the bottom block 3.

The aforesaid radiation fins 1, heat pipes 2, base block 3 and thermal pad 4 are tightly fastened together. By means of the heat expansion effect of the thermal pad 4 and the heat pipes 2, the parts of the cooler module fit one another tightly (the thermal conductivity of the heat pipes 2 is higher than that of the thermal pad 4). After installation of the cooler module, the thermal pad 4 is kept in close contact with the hot part of the electronic chip to transfer heat energy from the electronic chip to the heat pipes 2 rapidly for quick dissipation.

Because the parts of the cooler module fit one another tightly, the parts are firmly secured together without vibration, and the fabrication of the cooler module is easy and rapid, lowering the cost. Further, because the thermal pad 4 is kept with its large surface area in close contact with the hot part of the electronic chip, the surface contact between the thermal pad 4 and the electronic chip is reinforced upon a heat expansion. Therefore, the cooler module provides excellent thermal conduction and heat dissipation performance. Further, because the invention eliminates tin soldering, the fabrication of the cooler module does not cause environmental pollution, i.e., the invention is in conformity with environmental regulations.

Figure 5:
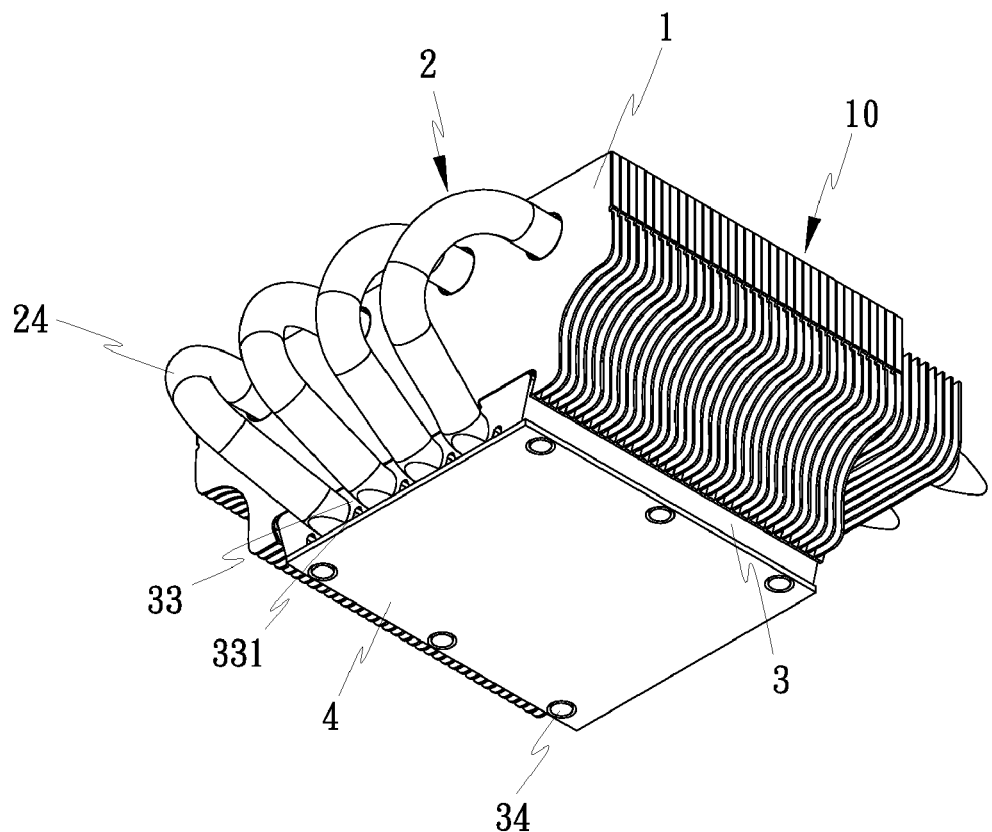
FIG. 5 is a bottom perspective view of the cooler module in accordance with the first embodiment of the present invention.
Figure 6:
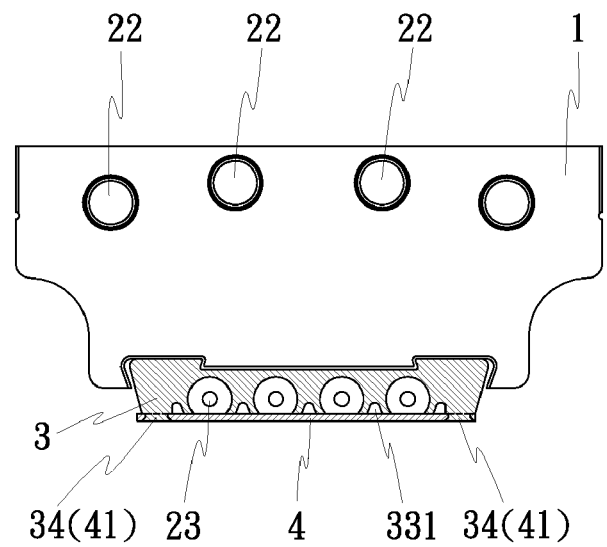
FIG. 6 is a cross-sectional view of the cooler module in accordance with the first embodiment of the present invention.
Figure 7:
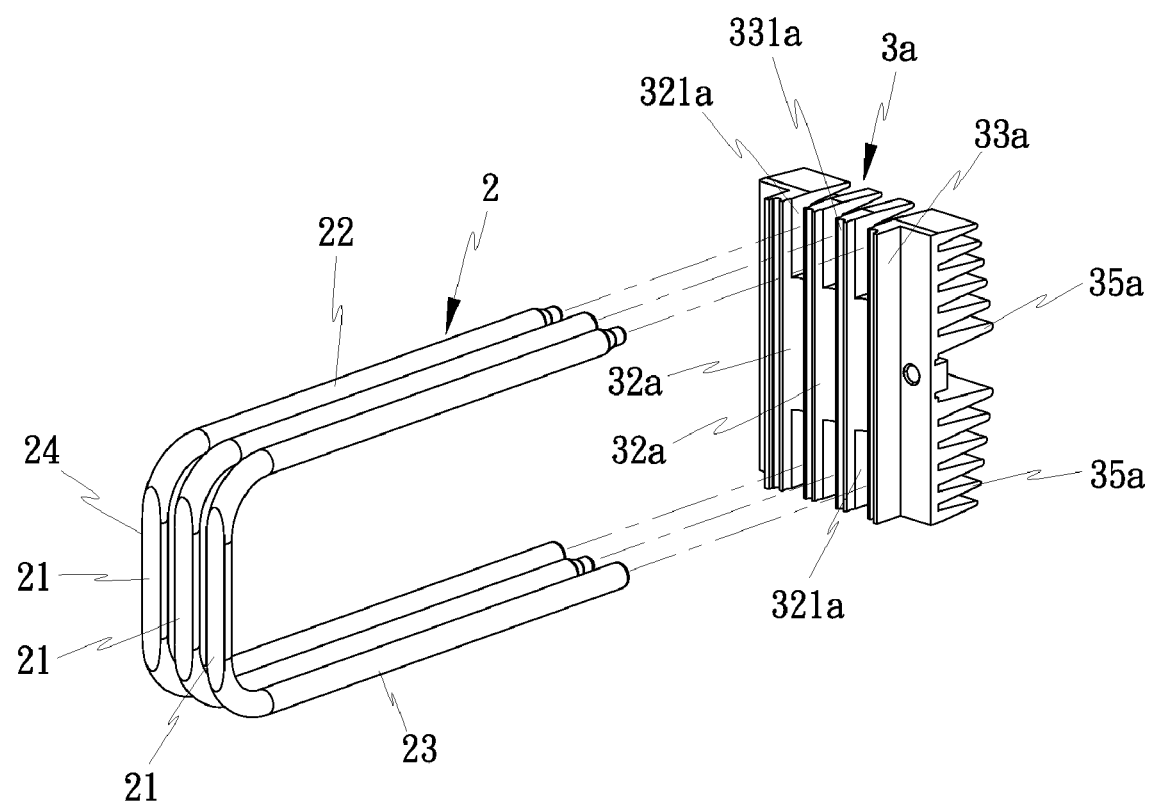
FIG. 7 is a top perspective view of a cooler module in accordance with a second embodiment of the present invention.
Figure 8:
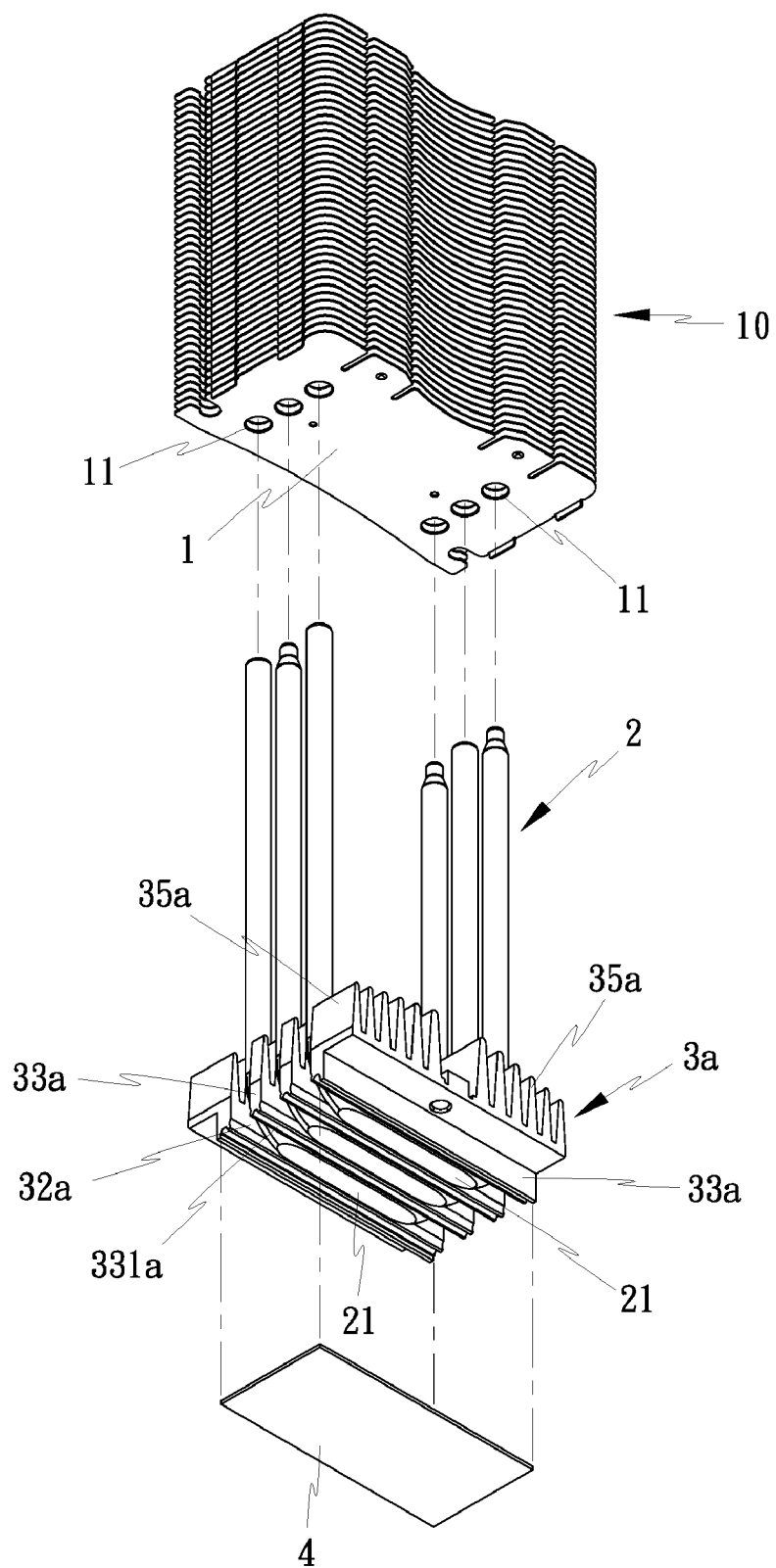
FIG. 8 is an exploded view of the cooler module in accordance with the second embodiment of the present invention.
Figure 9:
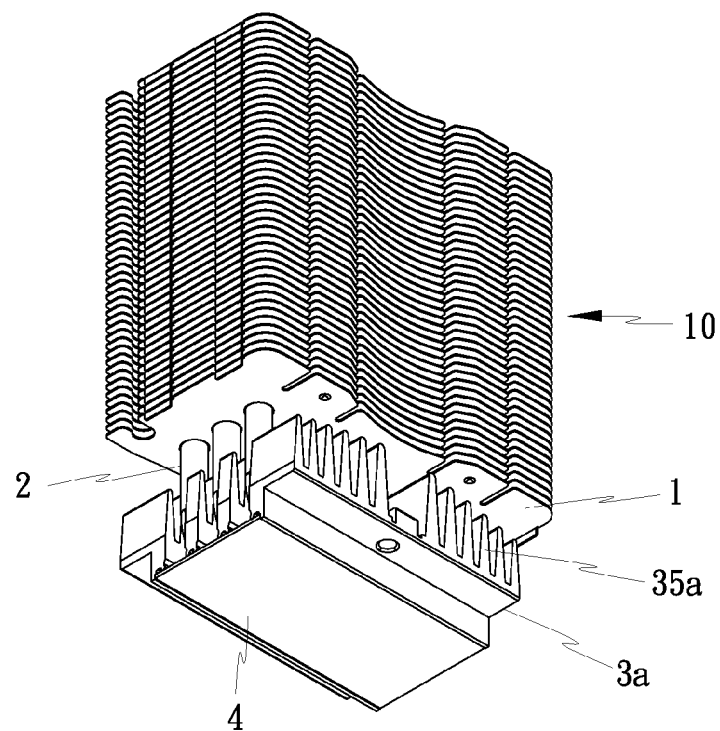
FIG. 9 is an elevational assembly view of the cooler module in accordance with the second embodiment of the present invention.
Figure 10:
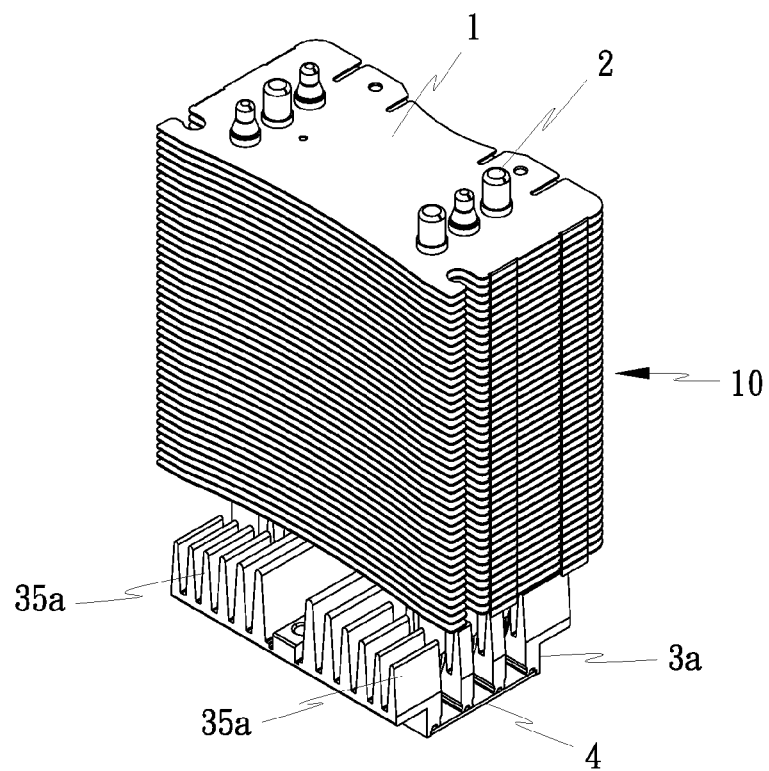
FIG. 10 corresponds to FIG. 9 when viewed from another angle.

The clamping ribs 33 of the base block 3 are respectively disposed at two sides of each of the bottom open grooves 32, each having a longitudinal cut 331. By means of the longitudinal cuts 331, the clamping ribs 33 are transversely compressible. When setting the heat pipes 2 into the respective bottom open grooves 32, the clamping ribs 33 are radially compressed and clamped on the associated heat pipes 2 (see FIGS. 5 and 6).

In addition to the configuration shown in FIGS. 1~4, the base block 3 can be extruded from copper in any of a variety of other shapes to match the heat pipes 2.

FIGS. 7~10 show a cooler module in accordance with a second embodiment of the present invention. According to this embodiment, the cooler module comprises a plurality of radiation fins 1, a plurality of heat pipes 2, an aluminum base block 3a, and a thermal pad 4. The base block 3a is a solid metal block extruded from aluminum, having a plurality of upright fins 35a perpendicularly protruded from the top wall, a plurality of bottom open grooves 32a arranged on the bottom wall, a plurality of longitudinal cuts 321a respectively made in each of the two opposite ends of each of the bottom open grooves 32a (see FIG. 7), a plurality of clamping ribs 33a respectively extending along two opposite sides of each of the bottom open grooves 32a, and a plurality of longitudinal cuts 331a respectively formed in the clamping ribs 33a. When heat pipes 2 are set in the bottom open grooves 32a of the base block 3a, the clamping ribs 33a are forced to clamp the heat pipes 2, securing the heat pipes 2 firmly to the associated bottom open grooves 32a (see FIG. 8). The thermal pad 4 is bonded to the bottom wall of the base block 3a to shield the heat pipes 2. After installation, the two opposite sides of the thermal pad 4 are kept in close contact with the flat sections 21 of the heat pipes 2 and the hot part of the electronic chip (not shown) to transfer and dissipate heat from the electronic chip.

The base block 3a is extruded from aluminum for the advantage of low cost. The base block 3a matches the copper thermal pad 4. During heat expansion, the base block 3a and the thermal pad 4 are tightly secured together, and the thermal pad 4 is fully kept in contact with the hot part of the electronic chip to effectively transfer heat energy from the electronic chip to the heat pipe 2, enabling the heat pipe 2 to carry heat energy away from the electronic chip rapidly. This second embodiment is less expensive, however it achieves the same effect as the aforesaid first embodiment of the present invention.

In the aforesaid first embodiment as shown in FIGS. 1~6, the heat pipes 2 each have a first extension arm 22 disposed at one end and tightly fitted into the through holes 11 of the radiation fins 1 of the heat sink 10, and a second extension arm 23 tightly fitted into the bottom wall of the base block 3 and covered by the thermal pad 4. The flat section 21 of each heat pipe 2 is formed on the bottom wall of the second extension arm 23.

In the aforesaid second embodiment as shown in FIGS. 7~10, the first and second extension arms 22 and 23 of the heat pipes 2 are respectively and tightly inserted through the radiation fins 1 of the heat sink 10, and the U-turn 24 of each heat pipe 2 between the associated first extension arm 22 and the associated second extension arm 23 is respectively and tightly fitted into the bottom open grooves 32a of the base block 3a (the flat section 21 of each heat pipe 2 is formed on the bottom side of the associated U-turn 24). After setting of the U-turn 24 of each of the heat pipes 2 into the bottom open grooves 32a of the base block 3a, the first and second extension arms 22 and 23 extend through the longitudinal cuts 321a of the bottom open grooves 32a respectively and the thermal pad 4 is fastened to the bottom wall of the base block 3a to hold down the U-turns 24 of the heat pipes 2.

A prototype of cooler module has been constructed with the features of FIGS. 1~10. The cooler module functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A cooler module, comprising a heat sink formed of a stack of radiation fins, a base block attached to said heat sink, a plurality of heat pipes tightly inserted through the radiation fins of said heat sink and closely attached to said base block, and a thermal pad fastened to said base block to hold down said heat pipes, wherein:

said base block is a metal block, having a top wall fitting one side of said heat sink, a plurality of bottom open grooves formed on a bottom wall thereof, and a plurality of clamping ribs respectively extending along two opposite sides of each of said bottom open grooves, said clamping ribs each having a longitudinal cut;

said heat pipes each have a mounting part tightly fitted into said bottom open grooves of said base block and a flat wall portion formed on said mounting part and kept in flush with the bottom wall of said base block; and said thermal pad is a thin sheet of metal fixedly fastened to the bottom wall of said base block to hold down said heat pipes in said bottom open grooves and kept in close contact with the bottom wall of said base block.

2. The cooler module as claimed in claim 1, wherein said radiation fins of said heat sink each have a bottom notch fitting over the top wall of said base block.

3. The cooler module as claimed in claim 1, wherein the mounting part of each of said heat pipes is an extension arm disposed at one end of the respective heat pipe.

4. The cooler module as claimed in claim 1, wherein the mounting part of each of said heat pipes is a U-turn.

5. The cooler module as claimed in claim 1, wherein said base block is made out of copper or aluminum.

6. The cooler module as claimed in claim 1, wherein said thermal pad is made out of copper.

7. The cooler module as claimed in claim 1, wherein said thermal pad is affixed to the bottom wall of said base block by means of riveting or compression-bonding.

8. The cooler module as claimed in claim 1, wherein said base block has a plurality of upright fins perpendicularly protruded from the top wall.

9. The cooler module as claimed in claim 1, wherein said base block has a longitudinal cut in each of two distal ends of each of said bottom open grooves.

10. The cooler module as claimed in claim 1, wherein said heat pipes each have a first extension arm disposed at one end thereof and tightly inserted through the radiation fins of said heat sink, and a second extension arm disposed at an opposite end thereof and respectively fitted into the bottom open grooves of said base block; and the flat wall portion of each of said heat pipes is formed on the second extension arm of the respective heat pipe.

11. The cooler module as claimed in claim 1, wherein said heat pipes each have two extension arms respectively and tightly inserted through the radiation fins of said heat sink, and a U-turn connected between said two extension arms; and the flat wall portion of each of said heat pipes is formed on the U-turn of the respective heat pipe.

12. The cooler module as claimed in claim 9, wherein said heat pipes each have two extension arms respectively and tightly inserted through the longitudinal cuts of the bottom open grooves and through the radiation fins of said heat sink, and a U-turn connected between said two extension arms; and the flat wall portion of each of said heat pipes is formed on the U-turn of the respective heat pipe.

13. The cooler module as claimed in claim 12, wherein said base block has a plurality of upright fins perpendicularly protruded from the top wall.

* * * * *